US 8,567,881 B2

(12) United States Patent
Hsiao

(10) Patent No.: US 8,567,881 B2
(45) Date of Patent: Oct. 29, 2013

(54) CONTAINER DATA CENTER

(75) Inventor: Yi-Liang Hsiao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 138 days.

(21) Appl. No.: 13/308,561

(22) Filed: Dec. 1, 2011

(65) Prior Publication Data

US 2013/0093301 A1 Apr. 18, 2013

(30) Foreign Application Priority Data

Oct. 17, 2011 (TW) .............................. 100137491 A

(51) Int. Cl.
*A47B 81/00* (2006.01)
(52) U.S. Cl.
USPC .................................... 312/223.1; 312/265.1
(58) Field of Classification Search
USPC ............. 312/198, 257.1, 265.1, 265.2, 265.3, 312/223.1, 265.4; 248/548, 345.1
See application file for complete search history.

(56) References Cited

U.S. PATENT DOCUMENTS

| 5,369,925 | A | * | 12/1994 | Vargo | 52/244 |
| 5,769,519 | A | * | 6/1998 | Nicolai | 312/351.1 |
| 6,006,925 | A | * | 12/1999 | Sevier | 211/26 |
| 6,036,290 | A | * | 3/2000 | Jancsek et al. | 312/265.4 |
| 6,293,637 | B1 | * | 9/2001 | Anderson et al. | 312/265.1 |
| 6,478,166 | B2 | * | 11/2002 | Hung | 211/26 |
| 6,561,602 | B1 | * | 5/2003 | Sevier et al. | 312/265.1 |
| 6,605,777 | B1 | * | 8/2003 | Anderson et al. | 174/50 |
| 6,951,288 | B2 | * | 10/2005 | Henderson | 211/26 |
| 8,267,262 | B2 | * | 9/2012 | Thelwell | 211/183 |
| 8,424,691 | B2 | * | 4/2013 | McMillan et al. | 211/26 |
| 2012/0090869 | A1 | * | 4/2012 | Bumeder et al. | 174/50 |
| 2012/0326583 | A1 | * | 12/2012 | Liu | 312/237 |

* cited by examiner

*Primary Examiner* — Daniel Rohrhoff
(74) *Attorney, Agent, or Firm* — Altis & Wispro Law Group, Inc.

(57) ABSTRACT

A container data center includes a rack and a cabinet. The rack includes a base and two spaced posts perpendicularly extending up from the base. A shockproof device is mounted to each post. The shockproof device includes an installing member embracing the post, a number of first shockproof members sandwiched between the installing member and the post, and a second shockproof member sandwiched between a bottom of the installing member and the base. The cabinet is mounted to the installing members.

12 Claims, 3 Drawing Sheets ntainer data center.
2. Description of Related Art
A container data center usually includes a container, and many cabinets each holding many servers and received in the container. However, during transportation of the container data center, the servers may be damaged due to vibration or shock.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
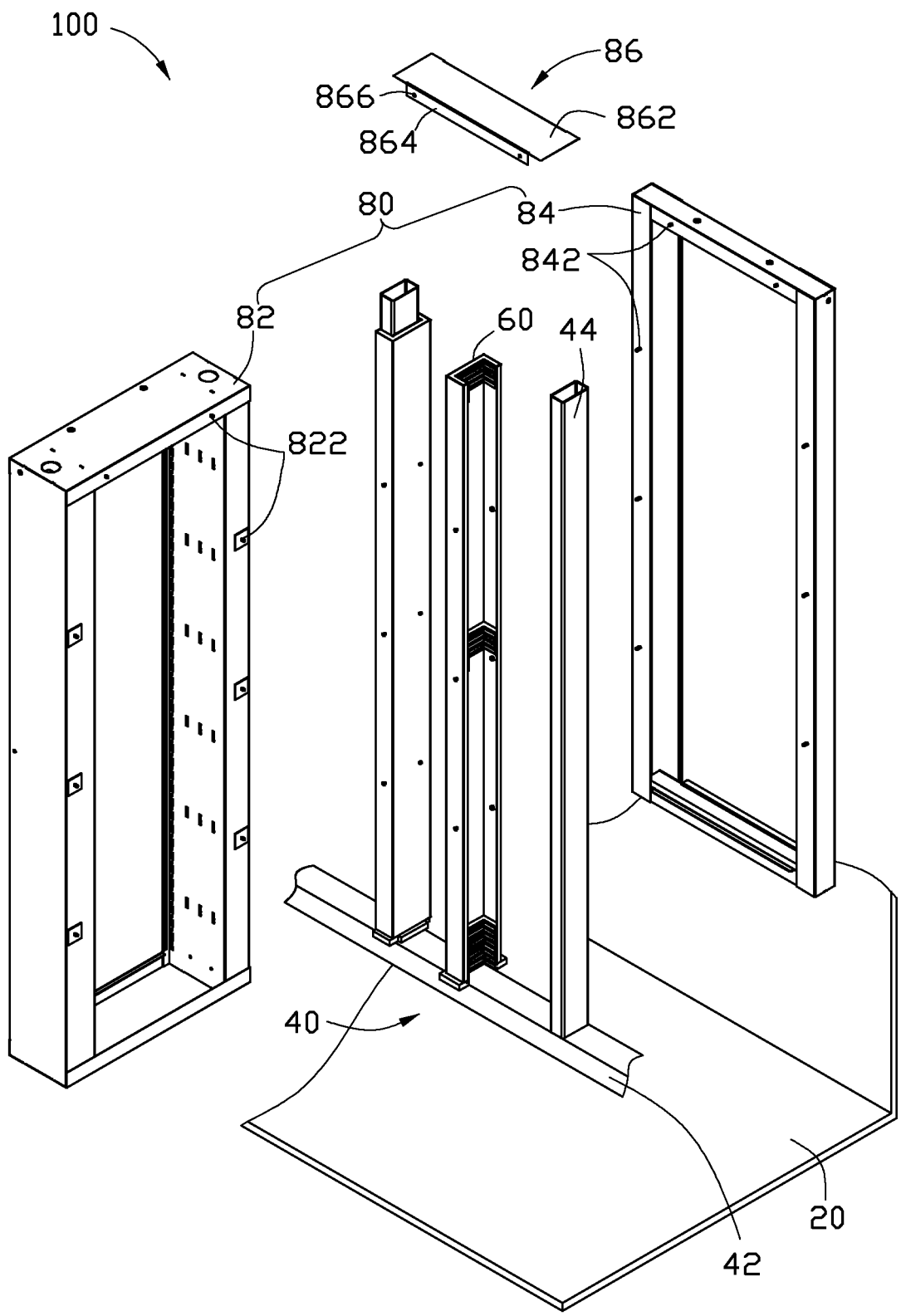
FIG. 1 is an exploded, partially cutaway, isometric view of an exemplary embodiment of a container data center, wherein the container data center includes a shockproof device.
Figure 2:
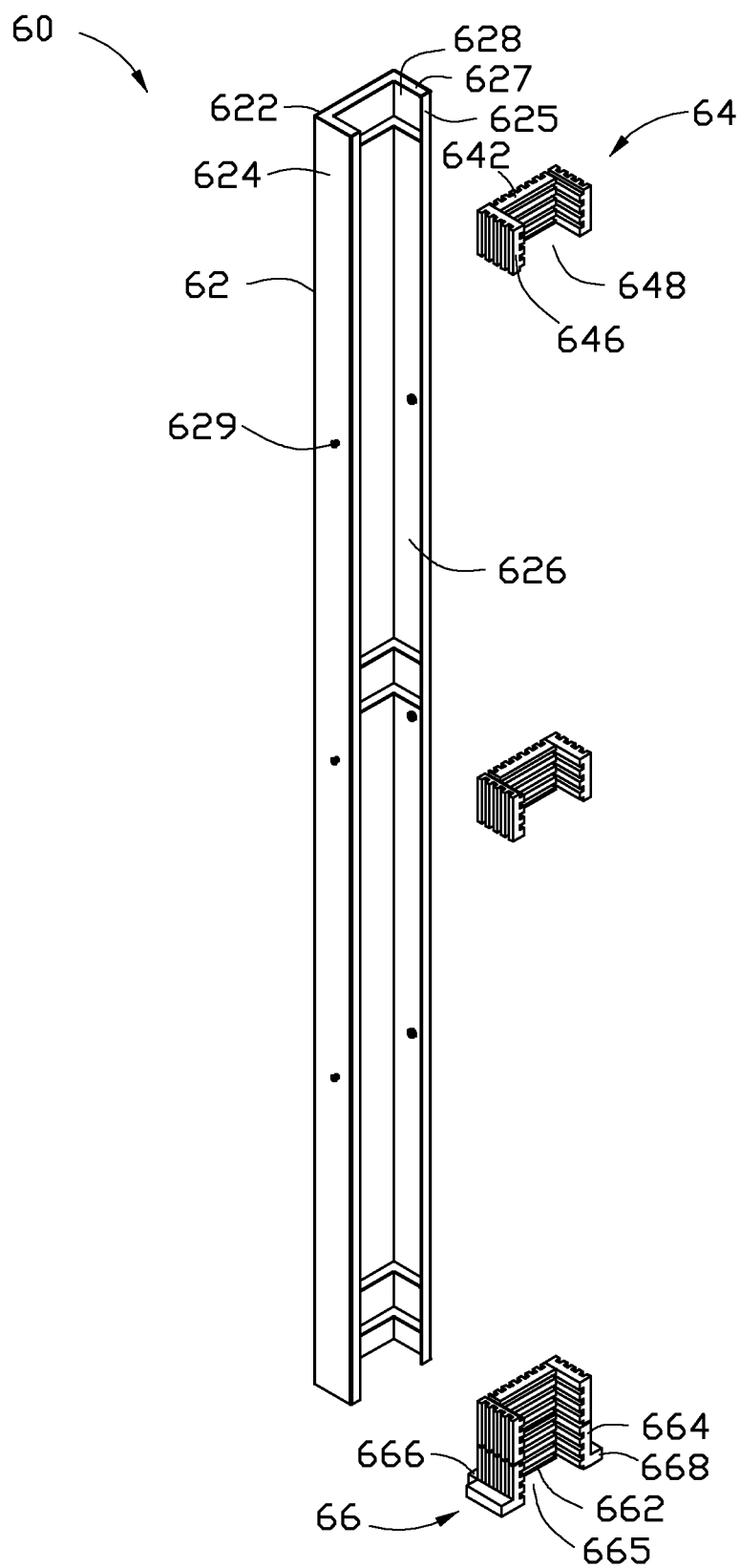
FIG. 2 is an exploded, isometric of the shockproof device of FIG. 1.

Referring to FIG. 1 and FIG. 2, an exemplary embodiment of a container data center 100 includes a container 20, a rack 40 mounted in the container 20, a plurality of shockproof devices 60, and a plurality of cabinets 80.

The rack 40 includes a base 42 mounted on a bottom wall of the container 20, and a plurality of spaced posts 44 perpendicularly extending up from the base 42. Each post 44 has a rectangular cross section.

Each shockproof device 60 includes a U-shaped installing member 62, a plurality of first shockproof members 64, and a second shockproof member 66.

The installing member 62 includes a rectangular plate 622 perpendicularly connected to the base 42, two flanges 624 perpendicularly extending out from two opposite sides of the plate 622. Two abutting tabs 625 extend toward each other from sides of the flanges 624 opposite to the plate 622. The plate 622, the flanges 624, and the abutting tabs 625 cooperatively bound a receiving slot 626. A plurality of U-shaped engaging pieces 627 is fixed to an inner surface of the installing member 62 and is received in the receiving slot 626. A receiving portion 628 is formed between every two adjacent engaging pieces 627. A middle of each flange 624 defines a plurality of fastening holes 629.

Each first shockproof member 64 is substantially U-shaped, and includes a rectangular first shockproof block 642 and two second shockproof blocks 646 protruding from two opposite ends of the first shockproof block 642. The first shockproof block 642 and the second shockproof blocks 646 cooperatively bound an accommodating space 648. The first shockproof block 642 and the second shockproof blocks 646 are made of vibration-resistant material, such as rubber, foam, or plastic.

Each second shockproof member 66 is substantially U-shaped, and includes a rectangular third shockproof block 662 and two fourth shockproof blocks 664 protruding from two opposite ends of the third shockproof block 662. The third shockproof block 662 and the fourth shockproof blocks 664 cooperatively bound an accommodating space 665. A resilient supporting block 666 protrudes out from a bottom of the third shockproof block 662, opposite to the accommodating space 665. A resilient supporting block 668 protrudes out from a bottom of each fourth shockproof block 664, opposite to the accommodating space 665. The third shockproof block 662 and the fourth shockproof blocks 664 are made of vibration-resistant material, such as rubber, foam, or plastic.

A plurality of electronic devices, such as servers, is fixed in each cabinet 80. Each cabinet 80 includes a first fixing shell 82, a second fixing shell 84, and a connecting member 86 connected between the first fixing shell 82 and the second fixing shell 84. A top and two opposite sides of a same side surface of the first fixing shell 82 define a plurality of through holes 822. A top and two opposite sides of a same side surface of the second fixing shell 84 defines a plurality of through holes 842.

The connecting member 86 includes a rectangular connecting plate 862 and two flanges 864 perpendicularly extending down from two opposite sides of the connecting plate 862. Each flange 864 defines a plurality of screw holes 866.

In assembly of the first and second shockproof members 64 and 66 to the installing members 62, each first shockproof member 64 is received in the corresponding receiving portions 628 of the installing member 62. Each second shockproof block 646 is sandwiched between the plate 622 and a corresponding abutting tab 625, abutting against inner surfaces of the flange 624 and the abutting tab 625. The first shockproof block 642 abuts against an inner surface of the plate 622. Each second shockproof member 66 is received in the receiving portion 628 adjacent to a bottom end of the installing member 62. The fourth shockproof blocks 664 abut against inner surfaces of the corresponding flanges 624. The third shockproof block 662 abuts against the inner surface of the plate 622. The supporting blocks 668 abut against bottoms of the corresponding flanges 624. The supporting block 666 abuts against a bottom of the plate 622.

Figure 3:
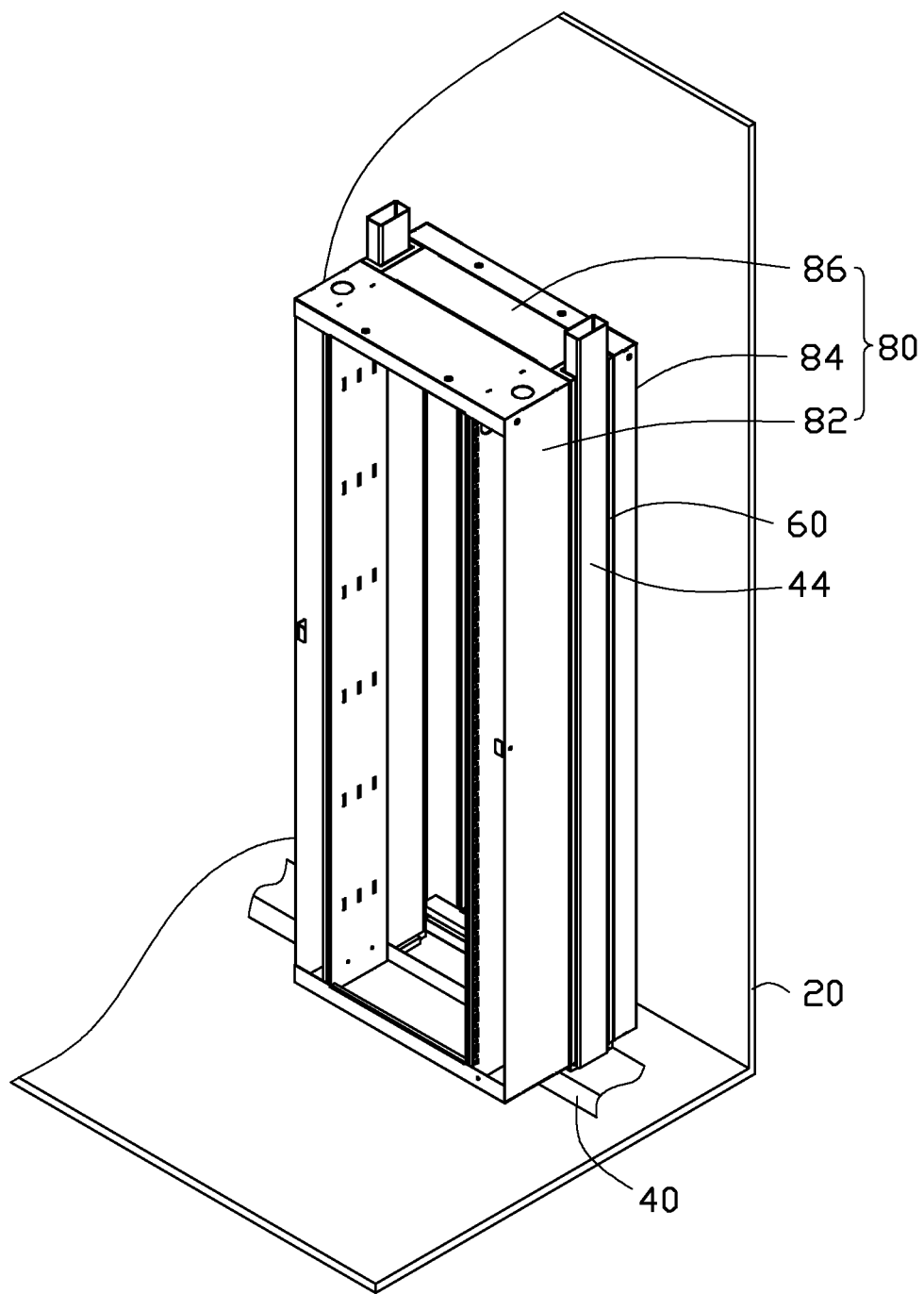
FIG. 3 is an assembled, isometric view of FIG. 1.

Referring to FIG. 3, in assembly of the shockproof devices 60 to the posts 44 of the rack 40, each post 44 is received in the receiving slot 626 of a corresponding shockproof device 60. The posts 44 are received in the accommodating spaces 648 and 665, and resiliently abut against the first and second shockproof members 64 and 66. Therefore, the bottom of each installing member 62 is resiliently supported on the supporting blocks 666 and 668 of the second shockproof member 66. Each plate 622 is resiliently engaged with the first shockproof blocks 642 and the third shockproof block 662. Each flange 624 is resiliently engaged with the second shockproof blocks 646 and the fourth shockproof blocks 664.

A plurality of first screws extend through the through holes 822 of the first fixing shell 82, to be screwed into the fastening holes 629 of the shockproof devices 60 on a same first side. A plurality of second screws extend through the through holes 842 of the second fixing shell 84, to be screwed into the fastening holes 629 of the shockproof devices 60 at a same second side opposite to the first fixing shell 82. The connecting member 86 is sandwiched between upper portions of the first and second fixing shells 82 and 84, to cover a top of a receiving space among the shockproof devices the first and second fixing shells 82 and 86. The receiving space can accommodate the servers. A plurality of screws extend through the corresponding through holes 822 and 842 of the first and second fixing shells 82 and 84, to be screwed into the screw holes 866 of the connecting member 86.

The first and second shockproof members 64 and 66 are resiliently sandwiched between the posts 44 and the installing members 62. The second shockproof blocks 66 are also resiliently sandwiched between the base 42 and the installing members 62. Because the first and second shockproof members 64 and 66 are resilient, a distance between two corresponding fastening holes 629 of the installing members 62 attached to the two posts 44 can be slightly adjusted to fit the first and second fixing shells 82 and 84.

The rack 40 is fixed to the container 20 by screwing or riveting the base 42 to the bottom wall of the container 20.

When the container 20 is shaken, the first shockproof members 64 and the second shockproof members 66 can absorb the energy of the vibrations or shocks.

It is to be understood, however, that even though numerous characteristics and advantages of the embodiments have been set forth in the foregoing description, together with details of the structure and function of the embodiments, the present disclosure is illustrative only, and changes may be made in details, especially in the matters of shape, size, and arrangement of parts within the principles of the embodiments to the full extent indicated by the broad general meaning of the terms in which the appended claims are expressed.

What is claimed is:

1. A container data center comprising:
   a container;
   a rack mounted in the container, and comprising a base fixed to a bottom wall of the container and two spaced posts extending up from the base;
   two shockproof devices respectively mounted to the posts, wherein each shockproof device comprises an installing member embracing the corresponding post, a plurality of resilient first shockproof members sandwiched between the installing member and the post, and a resilient second shockproof member sandwiched between a bottom the installing member and the base; and
   a cabinet mounted to the installing members;
   wherein each installing member is substantially U-shaped, and comprises a plate, two flanges extending from two opposite sides of the plate, and two abutting tabs extending toward each other from sides of the flanges opposite to the plate, the plate, the flanges, and the abutting tabs cooperatively bound a receiving slot for receiving the first and second shockproof members; and
   wherein a plurality of engaging pieces are fixed to the installing member in the receiving slot, along the lengthwise direction of the installing member, every two adjacent engaging pieces form a receiving portion for receiving the first shockproof member.

2. The container data center of claim 1, wherein the cabinet comprises a first fixing shell and a second fixing shell, the first fixing shell is fixed to the flanges of the installing members at a same first side, the second fixing shell is fixed to the flanges of the installing members at a same second side opposite to the first fixing shell.

3. The container data center of claim 1, wherein the first shockproof member is substantially U-shaped, and comprises a first shockproof block and two second shockproof blocks protruding from two opposite ends of the first shockproof block, each second shockproof block abuts against inner surfaces of the corresponding flange and the corresponding abutting tab, the first shockproof block abuts against an inner surface of the plate, the first and second shockproof blocks cooperatively bound an accommodating space for firmly receiving the corresponding post.

4. The container data center of claim 1, wherein each second shockproof member is substantially U-shaped, and comprises a third shockproof block abutting against an inner surface of the corresponding plate, and two fourth shockproof blocks protruding from two opposite ends of the third shockproof block and abutting against inner surfaces of the corresponding flanges and the corresponding abutting tabs, the third and fourth shockproof blocks cooperatively bound an accommodating space for firmly receiving the corresponding post.

5. The container data center of claim 4, wherein a resilient supporting block protrudes out from a bottom of each third shockproof block for resiliently supporting the installing member on the base.

6. The container data center of claim 4, wherein a resilient supporting block protrudes out from a bottom of each fourth shockproof block for resiliently supporting the installing member on the base.

7. The container data center of claim 1, wherein the first and second shockproof members are made of vibration-resistant material.

8. A container data center comprising:
   a container;
   a rack mounted in the container, and comprising a base fixed to a bottom wall of the container and two spaced posts extending up from the base;
   two shockproof devices respectively mounted to the posts, wherein each shockproof device comprises an installing member embracing the corresponding post, a plurality of resilient first shockproof members sandwiched between the installing member and the post, and a resilient second shockproof member sandwiched between a bottom the installing member and the base; and
   a cabinet mounted to the installing members;
   wherein each installing member is substantially U-shaped, and comprises a plate, two flanges extending from two opposite sides of the plate, and two abutting tabs extending toward each other from sides of the flanges opposite to the plate, the plate, the flanges, and the abutting tabs cooperatively bound a receiving slot for receiving the first and second shockproof members; and
   wherein each second shockproof member is substantially U-shaped, and comprises a third shockproof block abutting against an inner surface of the corresponding plate, and two fourth shockproof blocks protruding from two opposite ends of the third shockproof block and abutting against inner surfaces of the corresponding flanges and the corresponding abutting tabs, the third and fourth shockproof blocks cooperatively bound an accommodating space for firmly receiving the corresponding post.

9. The container data center of claim 8, wherein the cabinet comprises a first fixing shell and a second fixing shell, the first fixing shell is fixed to the flanges of the installing members at a same first side, the second fixing shell is fixed to the flanges of the installing members at a same second side opposite to the first fixing shell.

10. The container data center of claim 8, wherein the first shockproof member is substantially U-shaped, and comprises a first shockproof block and two second shockproof blocks protruding from two opposite ends of the first shockproof block, each second shockproof block abuts against inner surfaces of the corresponding flange and the corresponding abutting tab, the first shockproof block abuts against an inner surface of the plate, the first and second shockproof blocks cooperatively bound an accommodating space for firmly receiving the corresponding post.

11. The container data center of claim 8, wherein a resilient supporting block protrudes out from a bottom of each third shockproof block for resiliently supporting the installing member on the base.

12. The container data center of claim 8, wherein a resilient supporting block protrudes out from a bottom of each fourth shockproof block for resiliently supporting the installing member on the base.

\* \* \* \* \*